United States Patent
Feiweier et al.

(10) Patent No.: US 12,222,412 B2
(45) Date of Patent: Feb. 11, 2025

(54) PREPARING A MAGNETIC RESONANCE IMAGING METHOD IN COMPLIANCE WITH STIMULATION-BASED LIMITATIONS

(71) Applicant: Siemens Healthineers AG, Forchheim (DE)

(72) Inventors: Thorsten Feiweier, Poxdorf (DE); Max Müller, Erlangen (DE); Adam Kettinger, Erlangen (DE); Mario Zeller, Erlangen (DE); Gudrun Ruyters, Erlangen (DE)

(73) Assignee: Siemens Healthineers AG, Forchheim (DE)

( * ) Notice: Subject to any disclaimer, the term of this patent is extended or adjusted under 35 U.S.C. 154(b) by 0 days.

(21) Appl. No.: 18/592,973

(22) Filed: Mar. 1, 2024

(65) Prior Publication Data

US 2024/0295621 A1    Sep. 5, 2024

(30) Foreign Application Priority Data

Mar. 3, 2023    (DE) .................. 10 2023 201 945.0

(51) Int. Cl.
*G01V 3/00*        (2006.01)
*G01R 33/54*       (2006.01)
(Continued)

(52) U.S. Cl.
CPC ....... *G01R 33/543* (2013.01); *G01R 33/5608* (2013.01); *G01R 33/56341* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS 6,288,547 B1 * 9/2001 Heid .................. G01R 33/3852
                                                           324/322
11,460,526 B1    10/2022 Foo
(Continued)

FOREIGN PATENT DOCUMENTS

CN    104337516 A    2/2015
CN    115267629 A    11/2022
(Continued)

OTHER PUBLICATIONS

Decision to Grant Patent for German Application No. 10 2023 201 945.0 mailed Feb. 23, 2024, with English Translation.
(Continued)

*Primary Examiner* — Walter L Lindsay, Jr.
*Assistant Examiner* — Frederick Wenderoth
(74) *Attorney, Agent, or Firm* — Lempia Summerfield Katz LLC

(57) ABSTRACT

A method for preparing magnetic resonance imaging of an object under examination is described. A plurality of representative pulse sequence segments are generated, each of which is associated with a reference gradient amplitude of the gradient pulse having the highest stimulation potential of the representative pulse sequence segment, and the stimulation potential of which is representative of a group of partially different pulse sequences. For each of the representative pulse sequence segments, a maximum gradient slew rate is determined for which a permitted maximum value of the stimulation potential is not exceeded. One of the representative pulse sequence segments is determined and selected, for a measurement protocol to be planned for a magnetic resonance imaging to be performed, according to the gradient amplitude of the gradient pulse having the highest stimulation potential of a pulse sequence segment of the pulse sequence on which the measurement protocol is
(Continued)

based. The pulse sequence segment of the pulse sequence on which the measurement protocol is based is adjusted in such a way that a maximum gradient slew rate associated with the selected representative pulse sequence segment is also not exceeded by the pulse sequence segment of the pulse sequence on which the measurement protocol is based.

13 Claims, 5 Drawing Sheets

(51) Int. Cl.
  *G01R 33/56* (2006.01)
  *G01R 33/563* (2006.01)
(58) Field of Classification Search
  USPC .......................................................... 324/309
  See application file for complete search history.

(56) References Cited

U.S. PATENT DOCUMENTS

| | | | | |
|---|---|---|---|---|
| 2010/0308829 | A1* | 12/2010 | Vu | ........................... H03K 6/04 |
| | | | | 327/291 |
| 2015/0035531 | A1* | 2/2015 | Stemmer | ............ G01R 33/4824 |
| | | | | 324/309 |
| 2015/0097566 | A1 | 4/2015 | Grodzki | |
| 2015/0219736 | A1 | 8/2015 | Niederlhner | |
| 2015/0285885 | A1 | 10/2015 | Feiweier et al. | |
| 2019/0324105 | A1 | 10/2019 | Zeller | |
| 2022/0221541 | A1 | 7/2022 | Vom Endt | |
| 2022/0283254 | A1 | 9/2022 | Gebhardt | |

FOREIGN PATENT DOCUMENTS

| | | | |
|---|---|---|---|
| DE | 102014202183 A1 | | 8/2015 |
| DE | 102014206636 A1 | | 10/2015 |
| JP | 2018102352 A | * | 7/2018 |

OTHER PUBLICATIONS

German Office Action for Application No. 10 2023 201 945.0 mailed Dec. 14, 2023, with English Translation.

Hebrank, Franz X., and Matthias Gebhardt. "Safe-model-a new method for predicting peripheral nerve stimulations in MRI." Proc Intl Soc Mag Res Med. vol. 8. 2000. pp. 1-1.

International Standard—IEC IEC 60601-2-23 (Third edition—2011). Medical Electrical Equipment ISBN ISBN 978-2-88912-370-4. 2011. pp. 1-100.

* cited by examiner

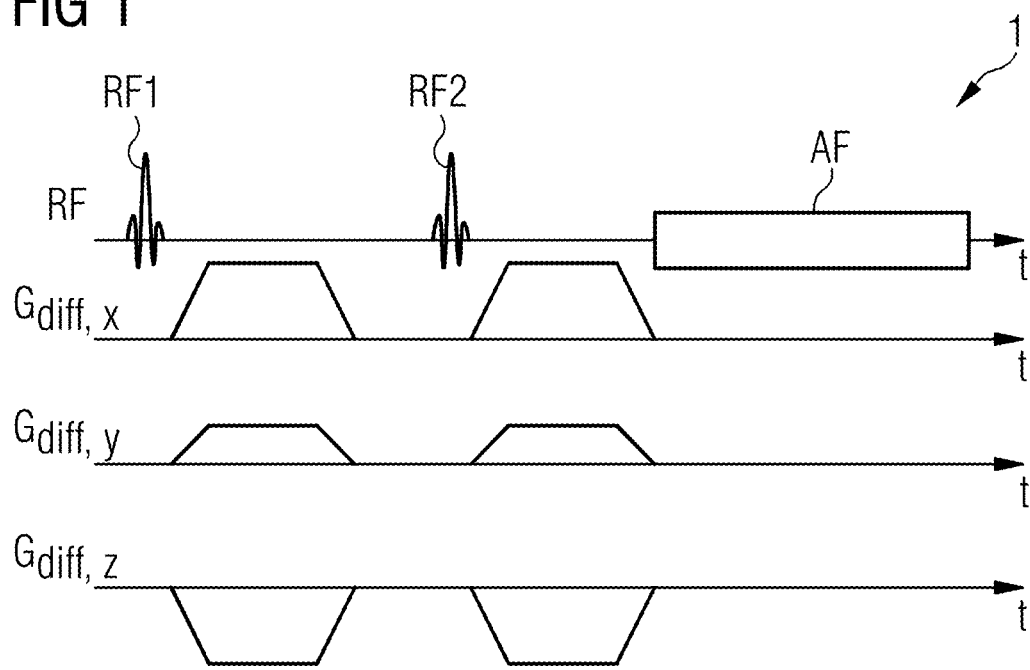
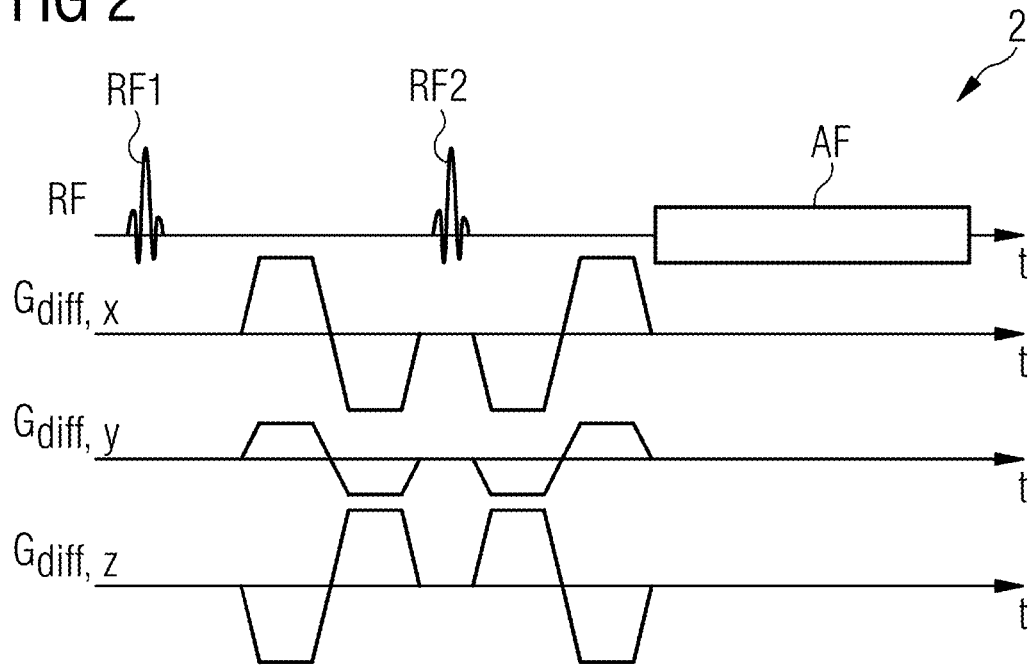

PREPARING A MAGNETIC RESONANCE IMAGING METHOD IN COMPLIANCE WITH STIMULATION-BASED LIMITATIONS

CROSS REFERENCE TO RELATED APPLICATIONS

This application claims the benefit of DE 10 2023 201 945.0 filed on Mar. 3, 2023, which is hereby incorporated by reference in its entirety.

FIELD

Embodiments relate to a method for preparing magnetic resonance imaging of an object under examination and to a magnetic resonance imaging method.

BACKGROUND

Imaging systems based on a method of magnetic resonance measurement, for example measurement of nuclear spins, also known as magnetic resonance tomography units or magnetic resonance imaging systems, have been successfully established and proven in a wide range of uses. The terms magnetic resonance imaging and magnetic resonance measurement or the abbreviated form "measurement" are used synonymously throughout the application text. These terms include for example also magnetic resonance measurements of abstract quantities that are not directly objective in nature, for instance measured quantities in a diffusion measurement. In addition, the term "series" is used synonymously with the term "sequence" when describing pulse sequences defined for a specific measurement.

In this form of image acquisition, a rapidly switched magnetic field known as the gradient field is usually superimposed on a static main magnetic field $B_0$, that is used for initial alignment and homogenization of magnetic dipoles under examination, for the purpose of spatial resolution of the imaging signal. In order to determine material properties of an object under examination to be mapped, the dephasing or relaxation time after deflection of the magnetization out of the initial alignment is ascertained in order to be able to identify different material-specific relaxation mechanisms or relaxation times. The deflection is usually performed by a number of RF pulses (the abbreviation RF stands for radiofrequency), also known as excitation pulses, and in this process the spatial resolution is based on timed manipulation of the deflected magnetization by the gradient field in what is known as a measurement sequence or control sequence, that specifies the precise timing of RF pulses, the precise timing of the change in the gradient field (by emitting a switching sequence of gradient pulses) and the precise timing of capturing the measured values.

An intermediate step is typically used to make an association between measured magnetization, from which the aforementioned material properties may be derived, and a spatial coordinate of the measured magnetization in the spatial domain in which the object under examination is situated. In this intermediate step, captured magnetic resonance raw data, also known as k-space data, is arranged at readout points in what is known as "k-space", where the coordinates of k-space are encoded as a function of the gradient field. The magnitude of the magnetization (for example of the transverse magnetization in a plane perpendicular to the aforementioned main magnetic field) at a specific position in the object under examination may be determined from the data at the readout point using a Fourier transform, that calculates a signal strength of the signal in the spatial domain from a signal strength (magnitude of the magnetization) associated with a particular frequency (the spatial frequency) or phase.

The time-dependent magnetic fields used in a magnetic resonance acquisition may lead to unwanted stimulation of the nervous system, for example to peripheral nerve stimulation and cardiac stimulation. The continual increase in performance of gradient systems in terms of their gradient amplitude and gradient slew rate is the main reason why constraints arising from physiological limitations are placed on the parameters selected for a pulse sequence, or more precisely their values. Although magnetic resonance imaging devices are equipped with monitoring devices, that immediately abort a measurement in progress if regulatory limit values are exceeded, it is usual even before starting an imaging process, in order to optimize the workflows, to carry out a check of the pulse sequence in use for compliance with the limitations mentioned, and to give the user the opportunity to make adjustments to the pulse sequence parameters or measurement parameters in order to comply with the limit values. The calculations that have to be carried out for this check, however, are quite complex depending on the modeling of the underlying physiological limitations. The increased computational effort may cause delays in the planning of the magnetic resonance imaging, leading to problems in the case of time-critical emergency examinations. In general, the increased length of time of the examination reduces the comfort of the patient and reduces the number of examinations per unit of time and hence the availability of a magnetic resonance imaging system.

Traditionally, gradient slew rates are selected in all cases, i.e., for all gradient pulses of an MR measurement, to be low enough that no stimulation may occur. The IEC standard (IEC is an acronym for "International Electrotechnical Commission") contains the limits to be observed for the change in the magnetic field over time or the change in the amplitude of the electric field. The disadvantage with this approach is that the limit values are very conservative and hence MR measurements may become unnecessarily slow.

The IEC standard therefore provides that more complex modeling on the basis of measurements on a representative cohort of subjects under examination may be carried out for the purpose of determining actual stimulation limits. One example of such modeling is the SAFE model, that uses a transfer function including a plurality of filtering, attenuation, rectification and combining steps to determine from the gradient time profiles for each gradient axis a numerical value that is representative of the stimulation potential of an MR examination (MR is an abbreviation of "magnetic resonance"). However, the complexity of the model and for example the dependency on the history of the gradient time profiles significantly increase the computational effort for checking the compliance with limit values.

It is therefore customary to employ this model in such a way that, for example, a check of the stimulation limits is not performed until immediately after the measurement request by the user, i.e., at a time at which all the measurement parameters are already specified. If this check finds that limit values are exceeded, the system may suggest to the user a choice of measurement parameter changes with which a measurement or MR imaging would be possible. The disadvantage with this approach is that the user only learns about the restrictions at a late stage, and the examination workflow is interrupted. In addition, the suggestions by the system often do not meet the requirements of the user, with the result that the user has to make manual adjustments and arrives at an implementable measurement protocol by iterations.

Alternatively, fixed measurement protocols may be defined that are checked in advance for compliance with stimulation limits. However, the user thereby loses the flexibility to be able to adjust MR examinations to the diagnostic needs of a particular patient.

It has also been proposed to take into account physiological limitations already during the planning of magnetic resonance imaging, and to limit the adjustable parameter ranges accordingly. Smart mathematical simplifications make it possible to significantly reduce the computational effort for complex modelings, with the result that the response time of the user interface normally remains fast enough or short enough to be able to be used in routine clinical practice. It has been found, however, that as the number of gradient pulses to be included in the check increases, delays may still arise in the setting of measurement parameters, that may impact on clinical processes, for example during emergencies.

In principle, the response time of the user interface may also be reduced by a more powerful computer. Apart from the higher costs of the hardware, however, it should be considered that the complexity of the modeling may still increase significantly, for instance if stimulation models were to be developed in the future that take into account the location and course of nerve paths.

BRIEF SUMMARY AND DESCRIPTION

The scope of the present disclosure is defined solely by the claims and is not affected to any degree by the statements within this summary. The present embodiments may obviate one or more of the drawbacks or limitations in the related art. Independent of the grammatical term usage, individuals with male, female or other gender identities are included within the term.

Embodiments facilitate planning and preparation of a magnetic resonance imaging method in a manner that saves time compared with conventional procedures, for example taking into account stimulation-related limitations and using appropriate parameter adjustments of the pulse sequence used.

In the method for preparing magnetic resonance imaging of an object under examination, first, in a preparation process, that is before the actual magnetic resonance imaging and before the adjustment of a measurement protocol for this specific magnetic resonance imaging, a plurality of representative pulse sequence segments are generated, each of which is associated with a reference gradient amplitude of the gradient pulse having the highest stimulation potential of the representative pulse sequence segment, and the stimulation potential of which is representative of a group of partially different pulse sequences. The stimulation potential is a figure that is calculated on the basis of the used stimulation model for a sequence of gradient pulses, and that states whether it is permissible to implement this gradient pulse sequence on a patient. For example, the stimulation potential may allocate the probability and/or strength of possible stimulations to a value range between 0.0 and 1.0, where for a value up to 0.8, measurements are possible without restrictions, for a value up to 1.0, measurements are possible after express confirmation by the operator or user, and for values greater than 1.0, measurements are not permitted. The representative pulse sequence segments may be confined to a short sub-series of a far larger pulse sequence or of a pulse sequence type of far larger extent containing additional gradient pulses, for example if only this short sub-series is relevant to the calculation of a stimulation potential. This simplification is useful for example for diffusion pulse sequences in which the diffusion gradients make the major contribution to the stimulation.

The representative pulse sequence segments are associated with specific pulse sequence types. Such pulse sequence types may include particular forms of excitation, encoding and readout, and they may also include pulse sequences for examining different types of measured quantities, for example for representing objects such as knees, organs, tendons, muscles, etc., or for representing fluids, for example blood, or dynamic processes such as the diffusion of fluids, blood flow, the flow of other fluids, etc.

As explained in detail later, it is also possible to make further distinctions for each pulse sequence type. For example, different representative pulse sequence segments may be determined for different pulse sequences of different polarity or having different polarity characteristics.

As already mentioned, each of the representative pulse sequence segments is also associated with a reference gradient amplitude of the gradient pulse(s) that have the highest stimulation potential and therefore dominate the stimulation behavior of the entire representative pulse sequence segment.

In addition, different representative pulse sequence segments may be generated that have different quantitative pulse sequence parameters or pulse sequence parameter values of the gradients, for instance the gradient pulse duration, the interval between the gradient pulses, and the amplitude of the gradients. In order to limit the computational effort, however, gradient slew rates may be calculated for different values of the parameters, for instance the gradient pulse duration or the interval between the gradient pulses, in the pre-calculation on a test basis, but then to store the smallest allowed gradient slew rate, representative of all the allowed values of these parameters, together with a pulse sequence segment common to, and representative of, these different values.

Thus in this preparation process, a maximum gradient slew rate for which a permitted maximum value of the stimulation potential is not exceeded is determined for each of the representative pulse sequence segments. If applicable, interpolation between two maximum gradient slew rates of different representative pulse sequence segments may also be performed in order to obtain a more accurate result for a maximum gradient slew rate if none of the stored representative pulse sequence segments come sufficiently close in terms of its sequence parameter values, for example the value of the reference gradient amplitude, to the actual pulse sequence, or if the limits of the allowed stimulation are meant to be exploited as fully as possible.

As explained in detail later, this preparation process, or this type of pre-calculation, is always performed before the actual preparation of a specific magnetic resonance imaging and the associated adjustment of a corresponding measurement protocol for a specific magnetic resonance imaging of an object under examination.

The aforementioned representative pulse sequence segments and associated maximum gradient slew rates are stored, for example in the form of a table, in a database, that is accessed when needed, i.e., for example during the actual preparation and planning of a measurement protocol for magnetic resonance imaging of a specific object under examination, directly before the start of this magnetic resonance imaging. The two general preparatory steps described generalize and bring forward some of the computational work for calculating permitted pulse sequences. This achieves a scaling effect because this calculation has to be performed only once, and the stored maximum gradient slew rates associated with the representative pulse sequence segments may be re-accessed at any time during planning and adaptation of a measurement protocol.

A step is also performed in which a measurement protocol is determined or adjusted for preparing and planning a specific measurement magnetic resonance imaging. This step may include editing by a user but also automatic adjustment of the measurement protocol by the magnetic resonance imaging system or a suitable computer program for adjusting the measurement protocol. Automated editing by the system may be relevant for example for (semi-) automated planning of measurements. In this case, the system may specify the number of slices needed to cover the anatomy under examination, or the extent and arrangement of the slices, also known as the "field of view" (FoV). In addition, the position and orientation of the region of interest (ROI) may be adjusted in an automated manner on the basis of landmarks (also known as "AutoAlign").

During the actual preparation and planning of a specific magnetic resonance imaging of a particular object under examination, one of the representative pulse sequence segments is then determined for a measurement protocol to be planned for a magnetic resonance imaging actually to be performed, and selected from the database, according to the gradient amplitude of the gradient pulse having the highest stimulation potential of a pulse sequence segment of the pulse sequence on which the measurement protocol is based. This determination takes place on the basis of the pulse sequence type and, if applicable, on the basis of one or more pulse sequence parameters or pulse sequence parameter values of the pulse sequence on which the measurement protocol is based. The representative pulse sequence segment need not necessarily be identical to the pulse sequence on which the measurement protocol is based. It is enough for the representative pulse sequence segment to be representative in terms of the physiological limitations of the pulse sequence on which the measurement protocol is based.

In other words, if, with a value of a sequence parameter, for example of a gradient slew rate, the selected representative pulse sequence segment complies with the physiological limitations then, with the same value, this should also always be true for the pulse sequence segment on which the measurement protocol is based. The selected pulse sequence segment is representative when the comparative pulse sequence segment of the pulse sequence on which the measurement protocol is based has the strongest stimulation in this pulse sequence, and its pulse sequence parameters, for example the gradient amplitudes, the duration of the gradients, the interval between the gradients, and the polarity of the gradients, each have values or properties that are covered by the representative pulse sequence segment in the sense that the maximum slew rate associated with the representative pulse sequence segment also holds for the specific values of the pulse sequence parameters of the pulse sequence on which the measurement protocol is based. If the respective values are not identical, it may also be the case that with the values of the representative pulse sequence segment, the determined maximum gradient slew rate may be expected to be less than the maximum permitted gradient slew rate of the pulse sequence on which the measurement protocol is based. In this case, although the determined value of the maximum gradient slew rate derived from the representative pulse sequence segment may not be optimum for the pulse sequence on which the measurement protocol is based, it does ensure compliance with the physiological limitations.

Finally, a step is performed for adjusting the pulse sequence on which the measurement protocol is based during planning of the measurement protocol of the magnetic resonance imaging in such a way that a maximum gradient slew rate associated with the selected representative pulse sequence segment is not exceeded by the pulse sequence or by a pulse sequence segment of the pulse sequence of the magnetic resonance imaging, that pulse sequence segment is associated with the representative pulse sequence segment. Advantageously at this stage, when usually little time remains for calculations, for instance in medical emergencies, there is no need to carry out a time-consuming calculation of maximum slew rates of pulse sequences for an actual measurement protocol because the necessary data is already stored, and only has to be identified or correlated with the pulse sequence of the actual measurement protocol, and selected. The described method steps may be performed in a fully automated manner, although some may also be performed through dialog with a user, who may personally adjust certain protocol parameters during the planning of the specific measurement, for instance.

In the magnetic resonance imaging method, the method for preparing magnetic resonance imaging of an object under examination is applied first. In other words, for example a measurement protocol for magnetic resonance imaging of an object under examination is planned and specified.

The subsequent magnetic resonance imaging for examination purposes then includes, as is standard practice, acquiring raw data from the object under examination by applying the pulse sequence corresponding to the measurement protocol.

Finally, as is standard practice, image data or other forms of spatially allocated measurement data, for example measured values that characterize the movement of water molecules by diffusion, from the object under examination are reconstructed on the basis of the acquired raw data.

For example in the case of diffusion imaging, it is advantageous if high-amplitude gradient pulses may be used in order to imprint in the shortest possible time on nuclear spins their current spatial position in the form of a signal phase, and later to detect a change in the position. Short encoding times are needed here in order to reduce signal loss resulting from relaxation effects and hence to acquire images of sufficient quality for a diagnosis as rapidly as possible. For short encoding times, the amplitudes of the diffusion gradients should thus be as high as possible, and the slew rates as high as possible. On the other hand, the physiological limitations should be observed. The method may now be used to specify in a time-saving manner optimized, or at least approximately optimized, slew rates and amplitudes for the diffusion gradients for a specific measurement.

The preparation device for a magnetic resonance imaging system is designed to control the magnetic resonance imaging system using the magnetic resonance imaging method. The preparation device includes a representative-data generation unit for generating a plurality of representative pulse sequence segments, each of which is associated with a reference gradient amplitude of the gradient having the highest stimulation potential of the representative pulse sequence segment, and the stimulation potential of which is representative of a group of partially different pulse sequences.

Part of the preparation device is also a rise determination unit for determining, for each of the representative pulse sequence segments, a maximum gradient slew rate for which a permitted maximum value of the stimulation potential is not exceeded.

The preparation device also includes a selection unit for determining and selecting, for a measurement protocol to be planned for a magnetic resonance imaging actually to be performed, one of the representative pulse sequence segments according to the gradient amplitude of the gradient pulse having the highest stimulation potential of a pulse sequence segment of the pulse sequence on which the measurement protocol is based.

The preparation device also may include an adaptation unit. The adaptation unit is configured to adjust the pulse sequence segment of the pulse sequence on which the measurement protocol is based during planning of the measurement protocol of the magnetic resonance imaging in such a way that a maximum gradient slew rate associated with the selected representative pulse sequence segment is not exceeded. This adjustment preferably includes adjusting a protocol parameter of the measurement protocol to be planned in such a way that a maximum gradient slew rate associated with the selected representative pulse sequence segment is not exceeded. As explained in detail later, this adjustment includes adjusting an entire defined protocol parameter range, that is displayed to the user, from which a value of a protocol parameter may be selected without exceeding or breaking a limit for nerve stimulation.

A protocol parameter typically refers to a parameter that may be set by the user and that defines the measurement in terms of the mapped geometry or in terms of its contrast performance. Those protocol parameters that affect the timing and amplitude of gradient pulses are relevant to stimulations. In the case of diffusion imaging, the diffusion encoding gradients have a high stimulation potential. For example, the shape and amplitude are influenced by the diffusion encoding mode chosen by the user, the choice of diffusion directions or the diffusion weighting. The time available for the diffusion encoding (either defined directly by the user or indirectly via the echo time TE and the duration of further parts of the measurement sequence that are to be applied within the echo time TE) also plays a part here. Protocol parameters that define the gradient pulses used for the spatial encoding (for instance the spatial resolution or the size of the mapping region) may also be relevant to stimulations, however.

The preparation device shares the advantages of the method for preparing magnetic resonance imaging of an object under examination.

The magnetic resonance imaging system includes the preparation device. The magnetic resonance imaging system shares the advantages of the method for preparing magnetic resonance imaging of an object under examination.

An implementation largely in software has the advantage that magnetic resonance imaging systems already in use or their control devices may be easily upgraded by a software update in order to work in the manner.

Most of the aforementioned method steps of the method for preparing magnetic resonance imaging of an object under examination, or of the magnetic resonance imaging method, for example generating a plurality of representative pulse sequence segments, determining a maximum gradient slew rate, determining and selecting one of the representative pulse sequence segments, and adjusting a pulse sequence segment of the magnetic resonance imaging, may be implemented in full or in part in the form of software modules in a processor of a suitable computing system, for instance by a control device of a magnetic resonance imaging system or by a computer used to control the magnetic resonance imaging system.

An implementation largely in software has the advantage that even computing systems already in use may be easily upgraded by a software update in order to work in the manner. Embodiments provide a corresponding computer program product having a computer program, that may be loaded directly into a computing system and that contains program segments in order to perform the steps of the method for preparing magnetic resonance imaging of an object under examination when the program is executed in the computing system. The computer program product may include in addition to the computer program, if applicable, extra elements such as documentation and/or extra components for example, including hardware components, such as hardware keys (dongles etc.) for using the software for example.

For transfer to the computing system and/or to the control device, and/or for storage on, or in, the computing system or the control device, a computer-readable medium, for instance a memory stick, a hard disk or any other portable or permanently installed data storage medium may be used, on which the program segments of the computer program are stored, which program segments may be downloaded and executed by a computing system. For this purpose, the computing system may include, for example, one or more interacting microprocessors or the like.

In an embodiment of the method for preparing magnetic resonance imaging of an object under examination, a parameter value range is displayed to a user according to the maximum gradient slew rate, from which range the user may select a parameter value for the protocol parameter to be adjusted for the measurement protocol to be planned. The protocol parameter to be adjusted is a protocol parameter that affects the stimulation potential of the pulse sequence on which the measurement protocol is based. Advantageously, the user receives information about allowed protocol parameter values and does not have to "experiment" to find an allowed and desirable parameter value for a protocol parameter.

In the adjustment step, a value range of allowed protocol parameter values that is defined for planning the measurement protocol is modified in such a way that the determined maximum gradient slew rate is not exceeded. For example, it may happen that a protocol parameter value range is initially already defined by technical limits of a magnetic resonance imaging system. If applicable, this protocol parameter value range is now further constrained in order to avoid exceeding the limitation on the maximum gradient slew rate, which limitation is determined for the actual pulse sequence. Advantageously, the range modification prevents the user from initially entering parameter values outside this modified range and subsequently having to correct the entry.

It may happen that during the adjustment step, a user initially selects a first parameter value for a first parameter to be set. This first protocol parameter may be selected from a plurality of protocol parameters to be adjusted. Then a parameter value range for a second protocol parameter is displayed to the user according to the parameter value selected for the first parameter and according to the maximum gradient slew rate. This procedure may obviously be applied to any number of different protocol parameters to be adjusted, so for example more than two different protocol parameters. Advantageously, the user thus receives during the process of adjusting the measurement protocol "realtime information", that controls his further behavior in selecting the protocol parameters in such a way that the limits for the stimulation potential are observed. Thus instead of the user having to work out by trial and error "allowed" protocol parameter values for the second protocol parameter, an allowed parameter range for the second protocol parameter is determined automatically on the basis of the representative pulse sequence segments stored in the database and the gradient slew-rate limits associated therewith, and displayed to the user.

In the above scenario, when selecting the first parameter value range, the user is shown a smaller "conflict-free" parameter value range, for example colored green, that does not require compensating by a suitable choice of a second parameter value, and a marginal region around this smaller parameter value range, for example colored red, from which the user may select a first parameter value but that must be compensated by a suitable choice of a second parameter value in order to satisfy the stimulation limits.

A situation may also arise in which a user deliberately does not adhere to a defined value range when selecting a first protocol parameter value because this specific value outside the value range is crucial to the success of his examination. In order to comply with the stimulation limits nonetheless, advantageously a value of a second protocol parameter from a plurality of protocol parameters to be adjusted is now adjusted in an automated manner according to the parameter value selected for the first parameter, and in such a way that the maximum gradient slew rate of the selected representative pulse sequence segment is still observed. Advantageously, a stimulation limit is observed even when a user does not follow the automatically recommended suggestions for the first protocol parameter value.

In an embodiment of the method for preparing magnetic resonance imaging, a representative pulse sequence segment includes one of the following gradient pulse sequences: a pair of gradient pulses of the same polarity; a pair of gradient pulses of different polarity; a series of gradient pulses of the same polarity, where the duration is preferably the characteristic time constant of the model of the representative pulse sequence segment; and a series of gradient pulses of alternating polarity, where the duration is preferably the characteristic time constant of the model of the representative pulse sequence segment.

The above-described variants of different pulse sequence types are relevant for example to the design of pulse sequences for diffusion imaging.

Since the mentioned characteristic properties of the aforementioned gradient pulse sequences contribute to different values of the stimulation potential, it is particularly useful and effective to carry out for these different types of gradient pulse sequences separate pre-calculations for the allowed maximum gradient slew rates. During the planning stage of a specific measurement protocol, it is then possible to use, according to the specific type of the gradient pulse sequence used in the specific measurement protocol, pre-calculated values for the stored representative gradient pulse segments, that fit the gradient pulse sequences of the same type provided by the specific measurement protocol more exactly than when there is no distinction based on these specific types.

For example, different types of representative pulse sequence segments may be relevant according to a selected setting of a measurement protocol. For example, for a first setting of a measurement protocol, a representative pulse sequence segment of identical polarity may be applied, and therefore a monopolar representative pulse sequence segment is preferred for determining suitable protocol parameter values, and for a second setting of the measurement protocol for a second measurement, a pulse sequence of alternating polarity is meant to be applied. Therefore for this second setting, a representative pulse sequence segment for determining suitable protocol parameter values is preferred if the physiological limitations depend on these specific characteristics in each case.

In the method, a representative pulse sequence segment may be selected that has a pulse sequence segment that is comparable in terms of the stimulation potential to a pulse sequence on which the measurement protocol is based. "Comparable" in this context is intended to mean that the stimulation potential of the comparable pulse sequence segment of the pulse sequence on which the measurement protocol is based is not higher, or at least not substantially higher, than that of the representative pulse sequence segment. For example, the comparable representative pulse sequence segment shall preferably have the same pulse sequence type or the same pulse sequence structure in terms of the gradient pulses relevant to the stimulation as the pulse sequence segment of the pulse sequence on which the measurement protocol is based. Advantageously, the pre-calculations already carried out for the representative pulse sequence segment and concerning compliance with a stimulation limit may be transferred to the pulse sequence on which a measurement protocol is actually based without having to repeat these pre-calculations.

A representative pulse sequence segment includes a plurality of gradient pulses, of which at least a first gradient pulse includes a reference gradient amplitude. In addition, in this variant, at least a second gradient pulse includes a gradient amplitude that differs from the reference gradient amplitude and influences the stimulation potential to a significantly lesser extent than the gradient pulse with the reference gradient amplitude. If the second gradient pulse is included in the calculation of the stimulation potential and of the maximum gradient slew rate, then a safer limit value is obtained for the latter than without taking into account the second gradient pulse.

There are also variants of the method in which the representative pulse sequence segment does not include such a second gradient pulse. In these variants, the calculation of the stimulation potential is particularly easy, because in this case only the first gradient pulse is used to calculate the stimulation potential.

In a sense, the second gradient pulse has an amplitude that may be defined individually according to a pulse sequence type or a protocol parameter. The representative pulse sequence segment may have a plurality of gradient pulses, where at least one of these gradient pulses has an individually defined amplitude. Other gradient pulses, on the other hand, may have the reference gradient amplitude. For example, the second gradient pulse of individually defined amplitude may have the amplitude $G_n = a_n * G_{ref}$, where $G_{ref}$ is the reference gradient amplitude of the first gradient pulse, and $a_n$ is a scalable factor defined for the second gradient pulse.

Advantageously, a particularly well-suited representative pulse sequence segment may be selected on the basis of the pulse sequence type or on the basis of a protocol parameter of the pulse sequence on which the actual measurement protocol is based, where the determining of the maximum gradient slew rate takes into account a desired gradient amplitude value of one or more gradients of the pulse sequence.

For this purpose, different maximum gradient slew rates are stored in the database for a plurality of ensembles of different gradient amplitudes, and a dataset containing the desired gradient amplitude value(s) are selected from the database, or else, if applicable, if the desired gradient amplitude value(s) of the reference gradient amplitude lies or lie between two stored values, an interpolation is performed between two datasets in order to obtain a more precise value for a limit of a gradient slew rate.

The determining of the table of representative pulse sequence segments and of the associated maximum gradient slew rates may also take into account amplitudes of other gradients in addition to the reference gradient amplitude. For example, a maximum gradient slew rate of a representative pulse sequence segment may be calculated according to a combination of a reference gradient amplitude of a diffusion gradient and an amplitude of an imaging gradient of the same pulse sequence segment.

The generating of the plurality of representative pulse sequence segments already takes place during the development of a computer program for magnetic resonance imaging for a magnetic resonance imaging system. The created data is advantageously always available in a database and there is no need to allow for any additional time for creating this data when used.

Alternatively, the generating of the plurality of representative pulse sequence segments may also be performed during startup of a magnetic resonance imaging system. This may be advantageous if a change to the equipment configuration, for instance a change to the gradient system, or a change to modeling parameters is made, and the representative pulse sequence segments are representative of a particular configuration. Thus this variant for example concerns the adjustment of hardware parameters.

The generating of the plurality of representative pulse sequence segments for a specific pulse sequence is preferably performed before the startup of a specific computer program for the magnetic resonance imaging using the specific pulse sequence. For example, there may be software modules for different pulse sequences known as sequence modules, that are parameterized specifically. In this variant, the pre-calculation for the representative pulse sequence segments may then take place only according to the selected software module, i.e., only after the software module has been selected. This approach may be advantageous if the representative pulse sequence segments are meant to be parameterized differently according to software module.

In a variant of the method for preparing magnetic resonance imaging, which variant is easy to implement, the determining of a maximum gradient slew rate is performed in such a way that this is not exceeded even for a maximum gradient amplitude. In this variant, only one maximum gradient slew rate has to be calculated and stored per parameter set because the limit of the gradient slew rate applies to any gradient amplitudes.

As already mentioned, it may be sensible to carry out the determining of a maximum gradient slew rate of a representative pulse sequence segment on the basis of a reference gradient amplitude that is less than the maximum gradient amplitude, and to calculate and store correspondingly maximum gradient slew rates for different reference gradient amplitudes. Advantageously, exposure limits may be utilized more fully, and, if applicable, the user may be provided with wider parameter value ranges for setting a measurement protocol.

A representative pulse sequence segment is selected for a measurement protocol to be planned according to the choice of a parameter value of the protocol parameter to be adjusted for the measurement protocol to be planned. Different representative pulse sequence segments may be relevant according to a setting of the measurement protocol. For example, for a first setting, a series of gradients of identical polarity may be applied. For a second setting, however, a series of alternating polarity is applied. If physiological limitations depend on these characteristics, then the representative pulse sequence segment appropriate to each may be selected automatically.

In the case of a complex stimulation model, for instance the SAFE model, it is usually not possible, however, to draw conclusions from the knowledge of a minimum permitted gradient slew rate for gradient pulses on one axis for cases in which gradients are applied simultaneously to a plurality of gradient axes.

Given such a pulse sequence, separate pre-calculations may then be carried out for all the directions applied during MR imaging, and those gradient slew rates having the greatest stimulation potential may be used. The direction combinations used are typically known in advance. If the user is able to define direction combinations, however, then the pre-calculations cannot take place until these directions are defined.

Usually therefore in magnetic resonance imaging, different gradient pulse profiles $G_x(t)$, $G_y(t)$, $G_z(t)$ are applied on the three gradient axes for a pulse sequence. In the simplest case, the stimulation potential caused by such a pulse sequence may be described by a stimulation model that considers all the axes independently of each other; thus the stimulation potential would be obtained by considering each of the three axes separately.

In an embodiment of the method, the pre-calculations for the representative pulse sequence segments are carried out independently for each of the three axes. Thus this variant takes full account of differences in the pulse sequences in different directions. In this process, a suitable representative pulse sequence segment is assigned to each axis for a particular segment of a pulse sequence to be planned, and, for each axis individually, a pre-calculated maximum gradient slew rate is calculated and applied, taking into account the gradient amplitude actually relevant to this axis.

If the computing effort is meant to be reduced, then for further simplification, all the axes are assigned the same representative pulse sequence segment and/or all the axes are assigned the same gradient slew rate, for example the lowest gradient slew rate of all three axes.

The SAFE model, however, that is often used in practice, combines stimulation contributions from all three axes with each other, that means that it is not possible to consider the three axes independently when applying the SAFE model. In this case, fundamentally the pre-calculations for each of the representative pulse sequence segments are preferably extended so as to take into account at least one reference gradient amplitude per axis. Hence the pre-calculation supplies for each 3-tuple ($G_{ref,x}$, $G_{ref,y}$, $G_{ref,z}$) an appropriate maximum gradient slew rate $S_{max}$. This greatly increases the effort for the pre-calculation, however.

For example in the case of the diffusion measurement, relevant directions of the diffusion encoding gradients are often already known at the time of the pre-calculation. This is because the user normally selects for a diffusion measurement a set of directions (each set may contain between one and several hundred directions), that are applied one after the other during the course of the measurement. These directions may be "fixed" in the program code; then the pre-calculations may already be carried out during the development of the software or when the program code is loaded. In some cases, the user may define these directions "freely", for instance in the form of a file containing direction information; in this case, the pre-calculation may be performed once on activation, for example when this file is loaded.

The pre-calculation in the context of the method is carried out in this variant preferably as follows:

First, the N direction vectors ($R_{i,x}$, $R_{i,y}$, $R_{i,z}$) to be acquired are known for a measurement to be planned, where i is from {1, N} and N is a natural number. For each of the N direction vectors, the stimulation model is used in the pre-calculation to determine a maximum gradient slew rate for each of the representative pulse sequence segments and according to a reference gradient amplitude $G_{ref}$. Therefore this works internally by using reference gradient pulses on all three axes according to the relationship $G_x = R_{i,x} G_{ref}$, $G_y = R_{i,y} G_{ref}$, $G_z = R_{i,z} G_{ref}$.

It is usually desirable to measure within a measurement all the diffusion directions with identical timing of the gradient pulses. Therefore, the smallest maximum gradient slew rate for all directions is stored for each representative pulse sequence segment and for each reference gradient amplitude.

Hence ultimately each set of direction vectors gets its own pre-calculation for each representative pulse sequence segment, allowing the maximum gradient slew rate to be determined rapidly for a given reference gradient amplitude.

The stimulation potential may depend on the relative orientation between the gradient direction and the anatomy of a patient. For example, the stimulation potential of a gradient along the dorsoventral direction may be stronger. Depending on the positioning of a patient in a tunnel-shaped MR scanner, this may be the physical y-gradient for positioning on the abdomen or on the back, or the physical x-gradient for positioning on the side.

To cover these cases, the pre-calculations of the stimulation values of the representative pulse sequence segments may also take into account a plurality of permutations of the gradient axes in addition to the direction combinations.

If, in a tunnel-shaped MR scanner having a main magnetic field along the horizontal z-axis, a direction combination is specified in physical coordinates xyz, i.e., not depending on the slice orientation of the measurement, then the permutations xy and yx are taken into account, that correspond to dorsal and lateral positioning respectively.

If the direction information is not specified in physical coordinates (i.e., in the xyz coordinate system of the gradient coil) but in logical coordinates (i.e., in the prs coordinate system of the imaging, where p=phase, r=read, s=slice), "worst case" assumptions may be used for the pre-calculation. Since the patient is orientated along the physical axes (dorsal position, ventral position, lateral position), one of these axes will have the highest stimulation potential. Hence the pre-calculation may take into account different assignments of prs coordinates to xyz coordinates, and the result that has the lowest maximum gradient slew rate may be stored. Thus, as described above, for a direction vector ($R_{i,p}$, $R_{i,r}$, $R_{i,s}$), the following are considered in succession in the pre-calculation:

$$G_x = R_{i,p} G_{ref}, G_y = R_{i,r} G_{ref}, G_z = R_{i,s} G_{ref}$$

$$G_x = R_{i,p} G_{ref}, G_y = R_{i,s} G_{ref}, G_z = R_{i,r} G_{ref}$$

$$G_x = R_{i,r} G_{ref}, G_y = R_{i,p} G_{ref}, G_z = R_{i,s} G_{ref}$$

$$G_x = R_{i,r} G_{ref}, G_y = R_{i,s} G_{ref}, G_z = R_{i,p} G_{ref}$$

$$G_x = R_{i,s} G_{ref}, G_y = R_{i,p} G_{ref}, G_z = R_{i,r} G_{ref}$$

$$G_x = R_{i,s} G_{ref}, G_y = R_{i,r} G_{ref}, G_z = R_{i,p} G_{ref}.$$

If a direction combination is specified in logical coordinates prs, i.e., depending on the slice orientation of the measurement, then all the permutations prs, psr, rps, rsp, spr, srp are taken into account before storing the result that has the lowest maximum gradient slew rate for the representative pulse sequence segment.

If the (known) direction vectors are specified in prs coordinates, and none of the direction vectors runs exactly parallel to the p-, r- or s-axis, then actually the "worst possible" slice tilt must be taken into account. In other words, precisely that tilt for which the gradient vector of amplitude $G_{i,xyz} = \sqrt{R_{i,p}^2 + R_{i,r}^2 + R_{i,s}^2} \cdot G_{ref}$ is applied exactly along the x-, y- or z-axis:

$$G_x = G_{i,xyz}; G_y = 0; G_z = 0$$

$$G_x = 0; G_y = G_{i,xyz}; G_z = 0$$

$$G_x = 0; G_y = 0; G_z = G_{i,xyz}.$$

If an open scanner having a main field along the vertical y-axis is used, then the following possibilities exist: the direction combination is specified in physical coordinates xyz, i.e. not depending on the slice orientation of the measurement; the direction combination is specified in logical coordinates prs, i.e. depending on the slice orientation of the measurement, with all the permutations prs, psr, rps, rsp, spr, srp being taken into account; and if the patient couch may rotate about the vertical axis in 900 steps, then even for direction combinations in physical coordinates xyz, all the permutations xyz, xzy, yxz, yzx, zxy, zyx must be taken into account.

If the rotation may be performed not just in 90° steps, then it becomes more complicated and it is not enough to take into account the permutations prs, psr, rps, rsp, spr, srp (based on a similar argument to that when considering the slice tilt in a tunnel-shaped scanner).

For an exact treatment, it is necessary to consider first the amplitude in the horizontal xz-plane: $G_{i,xz} = \sqrt{R_{i,x}^2 + R_{i,z}^2} \cdot G_{ref}$ and then consider the permutations resulting from the different positioning possibilities for a patient.

Further gradients may be taken into account when producing the representative gradient pulse sequences. For example, it may be the case for monopolar diffusion encoding that an imaging gradient of opposite polarity is applied between, before, or after the same-polarity encoding pulses. The pre-calculation may already take this into account, for instance by the calculation of the stimulation potential including an additional gradient of inverted polarity and of amplitude $G_{img}$ during the time interval A between the diffusion gradients.

A safety margin may be used in the pre-calculation of the maximum gradient slew rate $S_{max}$, for instance a 5% lower gradient slew rate S. The pre-calculation may thereby take account of the effect of inaccuracies, for example, because not all conceivable combinations of duration D and interval A of the gradients G are actually checked.

A monotonic dependency of the gradient slew rate on the gradient amplitude may be ensured in the pre-calculation of the maximum gradient slew rate. For example, if the pre-calculation for a higher gradient amplitude results in a faster slew rate than for the next-lower gradient amplitude, the former may be set to the slower value. In addition to better consistency, this also provides the opportunity to invert the dependency $S_{max}(G)$ and to calculate a maximum permitted gradient amplitude $G(S_{max})$ as a function of a slew rate $S_{max}$. This knowledge may be helpful when calculating particular gradient time profiles within the sequence.

Knowing the maximum permitted gradient amplitude $G(S_{max})$ may be helpful if a program for adjusting a measurement protocol is meant to define for a specified length of time T a trapezoidal gradient of maximum moment $M = \int_0^T dt\, M(t)$, in order to be able to specify the value range of a protocol parameter. If, because of complex hardware modelings, the maximum possible gradient amplitude is not immediately known, then a "trial and error" strategy may be used. In this case, for different slew rates, the associated maximum permitted gradient amplitude may be determined using $G(S_{max}x)$, and the optimum gradient shape may hence be determined by repeated trials.

Suitable measures may be used to speed up the pre-calculation. For example, the modeling may be designed such that the stimulation potential increases with rising gradient amplitude. In this case, the pre-calculation may start with high gradient amplitudes and then consider successively smaller gradient amplitudes. As soon as a gradient slew rate S that meets the performance limit of the hardware is possible for a particular parameterization of a representative pulse sequence segment, the same value may be assumed for all smaller gradient amplitudes G.

In order to speed up the pre-calculation further, it may be provided that of all the direction combinations of a pulse sequence, only those of the representative pulse sequence segments are taken into account that are expected to have the highest stimulation potential. The issue here is to limit the number of directions to investigate. This simplification may be applied in cases in which all the direction combinations have a directional vector $|G| = \mathrm{sqrt}(G_x^2 + G_y^2 + G_z^2)$ of identical length.

If, for example, directions are defined in physical xyz coordinates, then those directions are considered that have a maximum component of the gradient field along the x-, y-, z-axis. Which of the three axes stimulates most strongly depends on the orientation of the body or of the object under examination. This aspect is taken into account by permutations. If an identical value for the maximum component is obtained for two directions, then it is also possible to use the additional components for selecting the directions to be considered, for instance that direction amongst those with maximum x-component that have the highest y-component. This means that a maximum of six directions have to be considered, namely the maximum x-component in the event of ambiguity that has the highest y-component, the maximum x-component in the event of ambiguity that has the highest z-component, the maximum y-component in the event of ambiguity that has the highest x-component, the maximum y-component in the event of ambiguity that has the highest z-component, the maximum z-component in the event of ambiguity that has the highest x-component, and the maximum z-component in the event of ambiguity that has the highest y-component. The aspects considered in this section make it possible to limit to a maximum of six the number of directions actually to be taken into account in the pre-calculation. It is then necessary, however, to consider the permutations, as described earlier, for each of these six directions ($R_{i,x}$, $R_{i,y}$, $R_{i,z}$).

The pre-calculations may also be performed for different limit values of stimulation potentials. For example, the IEC standard defines a first limit value for a "First Level Controlled Mode" and a second limit value for a "Normal Mode", that equals 80% of the first limit value. Measurements in the "First Level Controlled Mode" require acknowledgment by the user that stimulations of the patient are more likely to occur. The invention may provide that the pre-calculation is performed for the currently active operating mode. Alternatively, pre-calculations may be carried out for both operating modes and the appropriate values applied in each case. The pre-calculation may also be selected independently of the actual operating mode, for instance on the basis of a parameter of the measurement protocol.

The method may also be combined with other approaches for checking stimulation limits. For example, the method may be combined with the method described in German patent application having official file reference 10 2022 213 903.8. In the method described in 10 2022 213 903.8, the user, on entering protocol parameter values, receives immediate feedback on whether the entered values are compatible with the nerve stimulation limit. The process of checking the protocol parameter values may advantageously be accelerated so greatly on the basis of the pre-calculation performed that communication with the user when specifying the measurement protocol via an operating system interface achieves acceptably short wait times.

The method may be applied when specifying gradient slew rates of the diffusion gradients, whereas the stimulation potential of the imaging gradients, for example of echoplanar imaging, is not checked until the actual imaging is started. The method ensures optimized ramp durations of the diffusion gradients and guarantees implementation is possible within the stimulation limits even when protocol parameters are edited. This restricts the solution space during the subsequent check at the start of the measurement in such a way that an appropriate choice of measurement parameter changes may be proposed quickly to the user.

BRIEF DESCRIPTION OF THE FIGURES

FIG. 1 depicts a representation of a pulse sequence for the diffusion measurement having a series of monopolar gradients according to an embodiment.

FIG. 2 depicts a representation of a pulse sequence for the diffusion measurement having a series of bipolar gradients according to an embodiment.

DETAILED DESCRIPTION

FIG. 1 depicts a representation of a pulse sequence 1 for the diffusion measurement containing radiofrequency pulses RF and a readout window AF in which radiofrequency measurement signals are received, and containing a series of monopolar gradients $G_{diff,x}$, $G_{diff,y}$, $G_{diff,z}$ according to an embodiment. The pulses and signals are each plotted over time t. In the diffusion measurement are used series of gradient pulses of very high amplitude in order to imprint in the shortest possible time on nuclear spins their current spatial position in the form of a signal phase, and later to detect a change in the position. Short encoding times are needed here in order to reduce signal loss resulting from relaxation effects, for example caused by transverse relaxation, and hence to acquire images of sufficient quality for the diagnosis as rapidly as possible.

Depending on the clinical issue and the body region, different series of diffusion gradient pulses $G_{diff}$ may be used here, for instance a pulse sequence with "monopolar" encoding (having gradient pulses of the same polarity), as is shown in FIG. 1. Such a series with a specific encoding may be, for example, the gradient pulse sequence that forms the basis of a measurement protocol for an actual measurement. Although the full measurement process, or the actual pulse sequence associated with this measurement process, may contain further gradients, in many cases it is the diffusion gradients that determine the stimulation potential, and therefore it may be sufficient to consider this sub-segment. FIG. 1 depicts in the first line of the mapped diagram an RF excitation pulse RF1 and an RF refocusing pulse RF2. Also shown in the first line is an acquisition window AF in which RF signals are received from a region of interest as echo signals. In the second line are shown diffusion gradients $G_{diff,x}$ encoded in a monopolar manner in the x direction, of which a first gradient is switched after the RF excitation pulse RF1, and a second gradient is switched after the RF refocusing pulse RF2. In the third and fourth lines in FIG. 1 are switched diffusion gradients $G_{diff,y}$, $G_{diff,z}$ in the y direction and in the z direction. Between the diffusion gradients in one direction there is a time interval in which the RF refocusing pulse RF2 is output. The gradients in different directions each have the same duration but some have a different amplitude. For the sake of clarity, further gradient pulses for the spatial encoding have been omitted from the diagram.

FIG. 2 depicts a representation 2 of a pulse sequence for the diffusion measurement having a series of bipolar diffusion gradients according to an exemplary embodiment. Each of the diffusion gradients $G_{diff,x}$, $G_{diff,y}$, $G_{diff,z}$, or the amplitude thereof, therefore alternates in sign.

Figure 3:
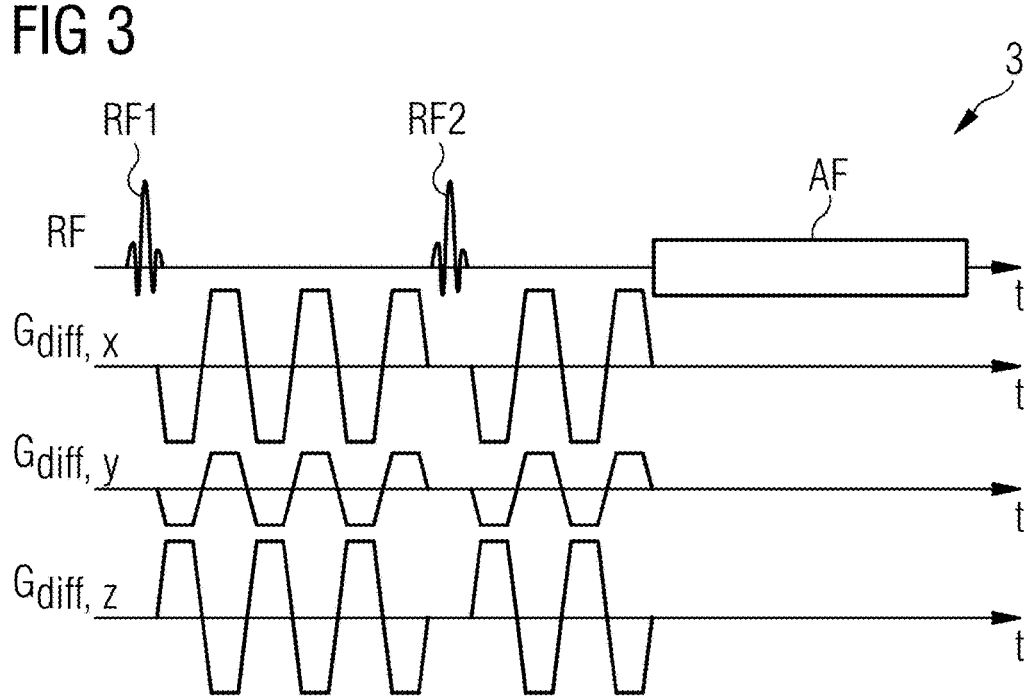
FIG. 3 depicts a representation of a pulse sequence for the diffusion measurement having a series of gradients encoded in an oscillating manner according to an embodiment.

FIG. 3 depicts a representation of a pulse sequence for the diffusion measurement having a series of gradients $G_{diff,x}$, $G_{diff,y}$, $G_{diff,z}$ encoded in an oscillating manner according to an exemplary embodiment. In this variant, the diffusion gradients $G_{diff,x}$, $G_{diff,y}$, $G_{diff,z}$ change their sign alike multiple times after the excitation and after the refocusing.

It is evident from the pulse sequences shown in FIG. 1 to FIG. 3 and that form the basis of an actual measurement protocol that a shorter duration of the gradient ramps, i.e., a higher slew rate S, allows a shorter time interval between the excitation module and the readout module AF. Since the diffusion gradients have high amplitudes, the stimulation potential rises considerably with shorter ramps. Therefore when preparing for MR imaging, the stimulation potentials and permitted maximum gradient slew rates S are calculated for representative pulse sequence segments associated with these pulse sequences. It is also possible to determine from the permitted maximum gradient slew rates permitted ramp durations given by R=G/S, where R is the ramp duration, G the gradient amplitude, and S the gradient slew rate. In addition, the rise time T=1/S may also be calculated as an alternative to the gradient slew rate S.

Figure 4:
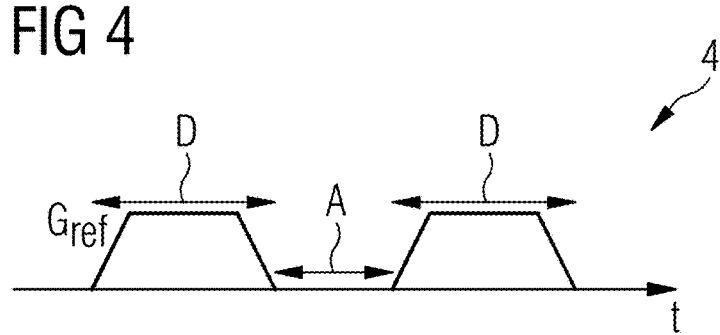
FIG. 4 depicts a representative pulse sequence segment for gradients of the pulse sequence shown in FIG. 1 according to an embodiment.

FIG. 4 depicts a representation 4 of a representative pulse sequence segment of gradients of the pulse sequence shown in FIG. 1 having the selectable parameters duration D, time interval A, and gradient amplitude $G_{ref}$.

A brief illustration of a pre-calculation of the aforementioned permitted ramp parameters or ramp parameter values is given for the monopolar representative pulse sequence segment shown in FIG. 4. At the time of this pre-calculation, neither the exact timing of the two gradients nor their actual amplitude are normally known. For this reason, slew rates S are determined for different gradient amplitudes G, and, for a number of possible timing options, a lower limit min of the maximum permitted slew rate of the individual series is determined as the maximum slew rate $S_{max}$ of an entire group of possible series. During later editing of an actual measurement protocol, a representative pulse sequence segment may then be picked from a database having the parameters of the actual measurement protocol, and its permitted slew rate $S_{max}$ used as a limit for specifying the actual measurement protocol.

For example, it is known for the diffusion measurement that the duration of diffusion encoding gradients lies in the range of 5 ms to 50 ms. In addition, for a particular type of gradient coils, the time constants of the SAFE model are known, that lie in the range of 1 ms to 10 ms. Hence for this scenario, it may be sufficient, for example, to consider gradient pulse durations of 1 ms to 30 ms and gradient pulse intervals of 0 ms to 30 ms. This parameter range captures cumulative effects of successive ramps as well as possible compensatory effects.

With regard to contributions to the stimulation that depend solely on the magnitude of the gradient rise, then series of rising and falling ramps at short time intervals may make a strong contribution. This cumulative effect is captured by gradient pulses of short duration and short interval. Such an effect exists, for example, for a series of monopolar gradient pulses of short duration D and short interval A.

With regard to contributions to the stimulation for which the sign of the rise is included in the calculation, a preceding falling ramp may reduce the magnitude of a subsequent rising ramp. This compensation effect, however, is reduced by longer gradient pulses of larger time interval. Such a contribution thus has an effect in a series of gradient pulses of long duration D and long interval A.

The pre-calculation calculates in advance for a particular gradient amplitude G, for different combinations of duration D and time interval A of the monopolar gradient pulses, the maximum gradient slew rate $S_{max}(G,D,A)$ in each case. For a particular gradient amplitude $G=G_{ref}$ is then obtained as the lower limit for any values of the durations D and time intervals A of the gradients a common upper limit for the gradient slew rate $S_{max}(G)=\min_{D,A}(S_{max}(G,D,A))$. During the subsequent editing of the measurement protocol, in the simplest case, a pulse sequence for imaging may then be planned on a conservative basis using the maximum slew rate for the maximum gradient amplitude $G_{max}$ of the system $S_{max}(G_{max})$, or using the value relevant to the actual gradient amplitude G, for which value is stored in the database a maximum gradient slew rate $S_{max}(G)$, or for which value the maximum gradient slew rate $S_{max}(G)$ is calculated by interpolation of two adjacent tabulated values of maximum gradient slew rates.

Figure 5:
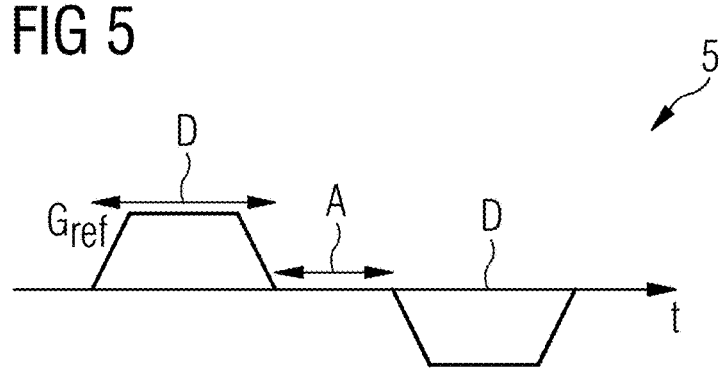
FIG. 5 depicts a representative pulse sequence segment for gradients of the pulse sequence shown in FIG. 2 according to an embodiment.
Figure 6:
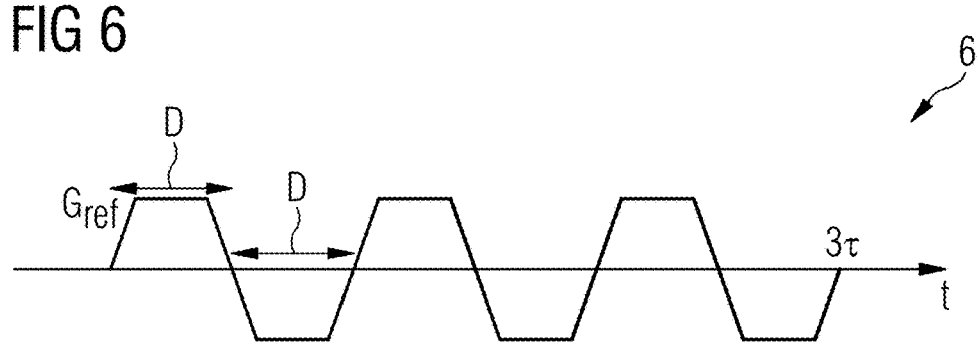
FIG. 6 depicts a representative pulse sequence segment for gradients of the pulse sequence shown in FIG. 3 according to an embodiment.

For the two representative pulse sequence segments shown in FIG. 5 and FIG. 6, that are bipolar and oscillating respectively, the procedure may be very similar to that for the representative monopolar pulse sequence segment shown in FIG. 4.

As illustrated in the representation 5 in FIG. 5, for the bipolar encoding, a gradient pair of time duration D and time interval A of the gradients, and an amplitude that may equal $+G_{ref}$ or $-G_{ref}$, is specified as a representative pulse sequence segment of a bipolar pulse sequence.

As illustrated in the representation 6 in FIG. 6, for an oscillating encoding, a series of alternating gradient pulses of duration D without any break, i.e., with the time interval A=0, is considered. In this case, the number of gradients to be taken into account for determining a stimulation potential SP of a representative pulse sequence segment is based on the relevant time constant r of the model used as the basis for calculating the stimulation potential, in this exemplary embodiment the SAFE model. For example, as many gradient pulses may be considered as may be applied within three times the longest time constant r.

Figure 7:
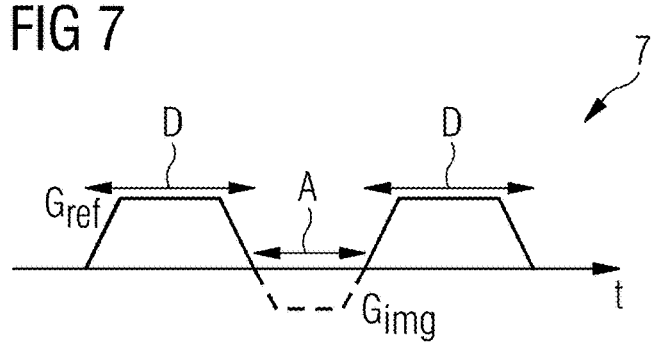
FIG. 7 depicts a representative pulse sequence segment of a pulse sequence for the diffusion measurement having an additional imaging gradient according to an embodiment.

FIG. 7 depicts a representation 7 of a representative pulse sequence segment of a pulse sequence for the diffusion measurement having an additional imaging gradient (shown dashed).

The imaging gradient shown in FIG. 7 is inserted in a monopolar pulse sequence and has an opposite polarity to the diffusion gradients (shown by continuous lines) of the pulse sequence and an amplitude $G_{img}$ that differs from the amplitude $G_{ref}$ of the diffusion gradients. The pre-calculation of maximum gradient slew rates $S_{max}$ may also take into account a modification of this type by generating representative pulse sequence segments containing additional imaging gradients, that are included in the pre-calculation of the maximum gradient slew rates.

For example, an imaging gradient for slice selection may be applied between the two diffusion gradients. Depending on the image orientation, this gradient may have a different sign from a subsequent or preceding diffusion gradient, and hence increase the stimulation potential.

If this actual pulse sequence were to be assigned that of FIG. 4 as the "representative" pulse sequence segment, then the stimulation potential might be underestimated using this "representative" pulse sequence segment, and therefore the representative pulse sequence segment shown in FIG. 4 would no longer be "representative".

Thus for this case, it would be better to assign the representative pulse sequence segment shown in FIG. 7 as the "representative pulse sequence segment".

Figure 8:
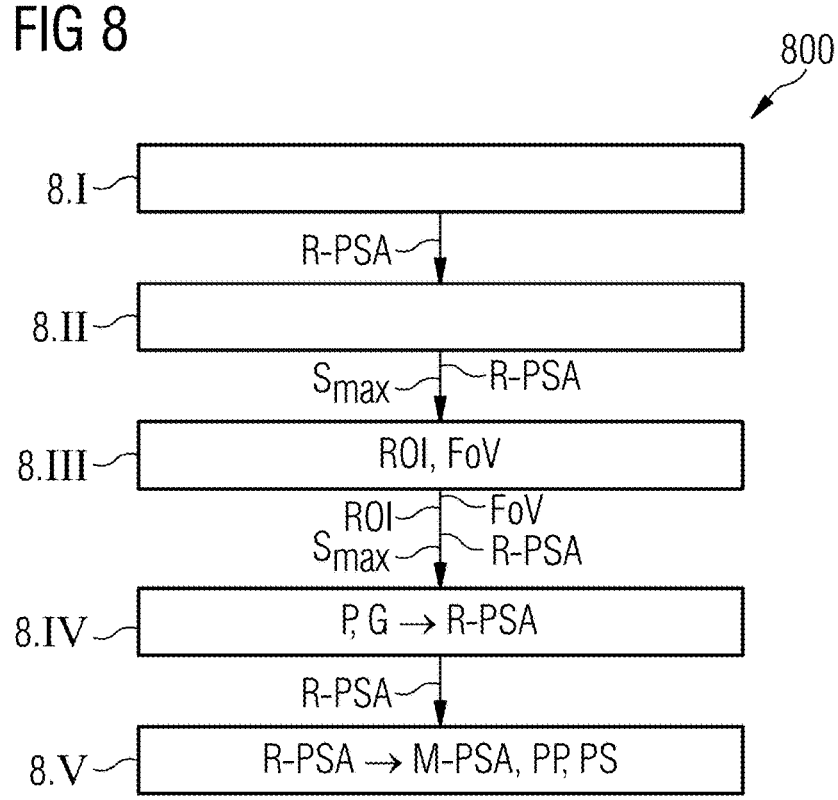
FIG. 8 depicts a flow diagram, that illustrates a method for preparing magnetic resonance imaging of an object under examination according to an embodiment.

FIG. 8 depicts a flow diagram 800, that illustrates a method for preparing magnetic resonance imaging of an object under examination according to an embodiment.

In step 8.I, a plurality of representative pulse sequence segments R-PSA are generated, each of which is associated with a reference gradient amplitude $G_{ref}$ of the gradient having the highest stimulation potential SP of the particular representative pulse sequence segment R-PSA, and the stimulation potential SP of which is representative of a group of partially different pulse sequences.

In step 8.II, a maximum gradient slew rate $S_{max}$ for which a permitted maximum value of the stimulation potential SP is not exceeded is determined for each of the representative pulse sequence segments R-PSA and for at least one reference gradient amplitude. Usually, however, an entire table of different gradient amplitude values G is generated, for each of which a maximum gradient slew rate $S_{max}(G)$ is determined.

Steps 8.I and 8.II are carried out once as part of the pre-calculation of the representative pulse sequence segments R-PSA and of their maximum gradient slew rates $S_{max}$.

In step 8.III, a measurement protocol P is opened for editing by a user or for automatic adjustment by a magnetic resonance imaging system. In step 8.III, the number and extent of the slices of a field of view (FoV) needed to cover a region of interest ROI are specified, if applicable in an automated or semi-automated manner. In addition, the position and orientation of the region of interest ROI may be adjusted in an automated manner on the basis of landmarks.

In step 8.IV, one of the representative pulse sequence segments R-PSA for a measurement protocol P to be planned for a magnetic resonance imaging actually to be performed is determined and selected according to a characteristic or the type of the pulse sequence PS on which the measurement protocol is based. Different types of representative pulse sequence segments R-PSA may be selected according to a setting of the measurement protocol. For example, for a first setting of the measurement protocol P, a representative pulse sequence segment R-PSA of identical polarity may be selected (see FIG. 1, FIG. 4). For a second setting of the measurement protocol, on the other hand, a representative pulse sequence segment R-PSA of alternating polarity is selected (see FIGS. 2, 3, 5, 6). The tables pre-calculated for the representative pulse sequence segment R-PSA may then be used to determine the maximum permitted gradient slew rate $S_{max}(G, R\text{-}PSA)$ according to the gradient amplitude G of a gradient pulse belonging to the pulse sequence PS on which the measurement protocol P is based.

In step 8.V, a pulse sequence segment M-PSA of the pulse sequence of the planned magnetic resonance imaging is adjusted in such a way that the determined maximum gradient slew rate $S_{max}$ is not exceeded.

Figure 9:
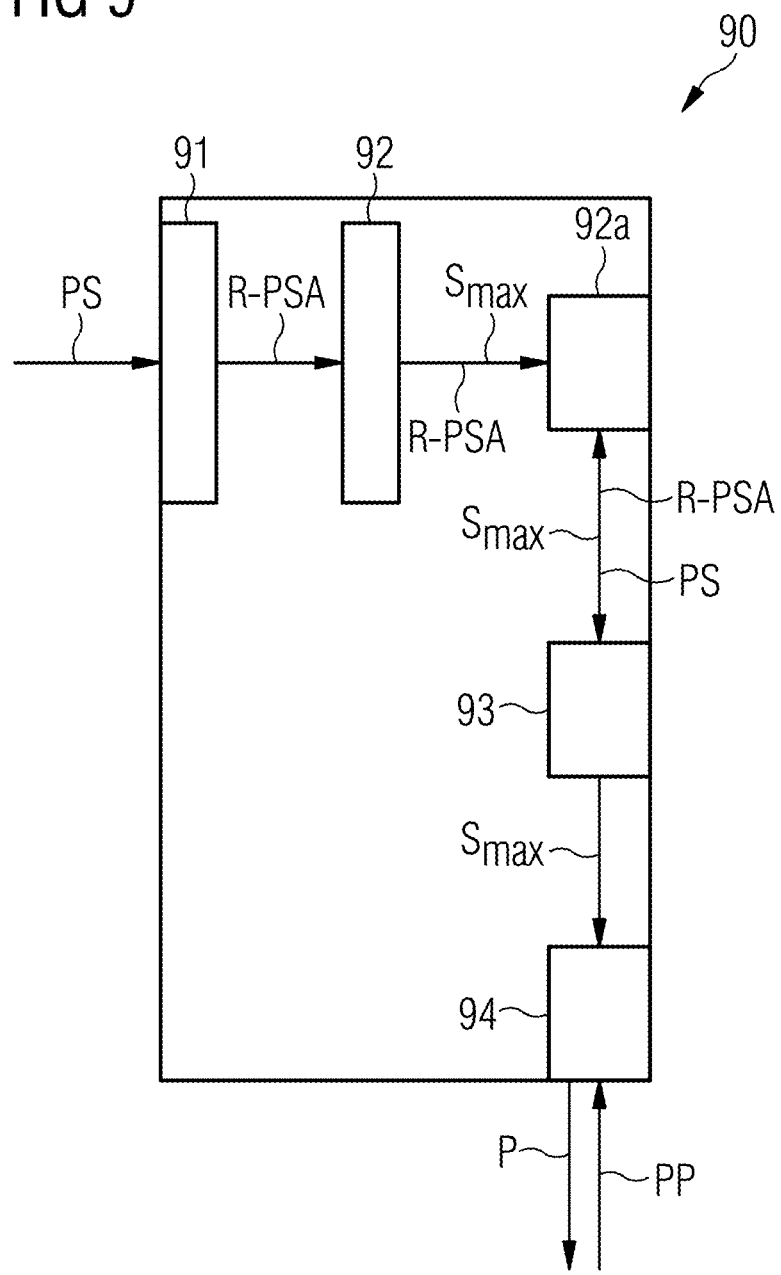
FIG. 9 depicts a schematic representation of a preparation device according to an embodiment.

FIG. 9 depicts a schematic representation of a preparation device 90 according to an embodiment.

The preparation device 90 has a representative-data generation unit 91. The representative-data generation unit 91 is configured to generate a plurality of representative pulse sequence segments R-PSA containing at least one gradient pulse and usually a plurality of gradient pulses. The amplitude of at least one of the gradient pulses that is responsible for the highest stimulation potential is scaled by a reference gradient amplitude $G_{ref}$ defined by an input parameter.

The preparation device 90 also includes a rise determination unit 92 for determining, for each of the representative pulse sequence segments R-PSA, a maximum gradient slew rate $S_{max}$ for which a permitted maximum value of the stimulation potential SP is not exceeded.

The preparation device 90 also has a database 92a, that stores the generated representative pulse sequence segments R-PSA with each of their associated maximum gradient slew rates $S_{max}$ for different reference gradient amplitudes $G_{ref}$, and retains for later planning of a specific measurement protocol P for magnetic resonance imaging.

Part of the preparation device 90 is also a selection unit 93 for determining and selecting for a measurement protocol P to be planned for a magnetic resonance imaging actually to be performed one of the representative pulse sequence segments R-PSA according to the highest gradient amplitude G of the pulse sequence PS on which the measurement protocol P is based.

The preparation device 90 also has an adaptation unit 94 for adjusting a protocol parameter PP of the measurement protocol P to be planned. The adjustment is made in such a way that a maximum gradient slew rate $S_{max}$ associated with the selected representative pulse sequence segment R-PSA is not exceeded.

Figure 10:
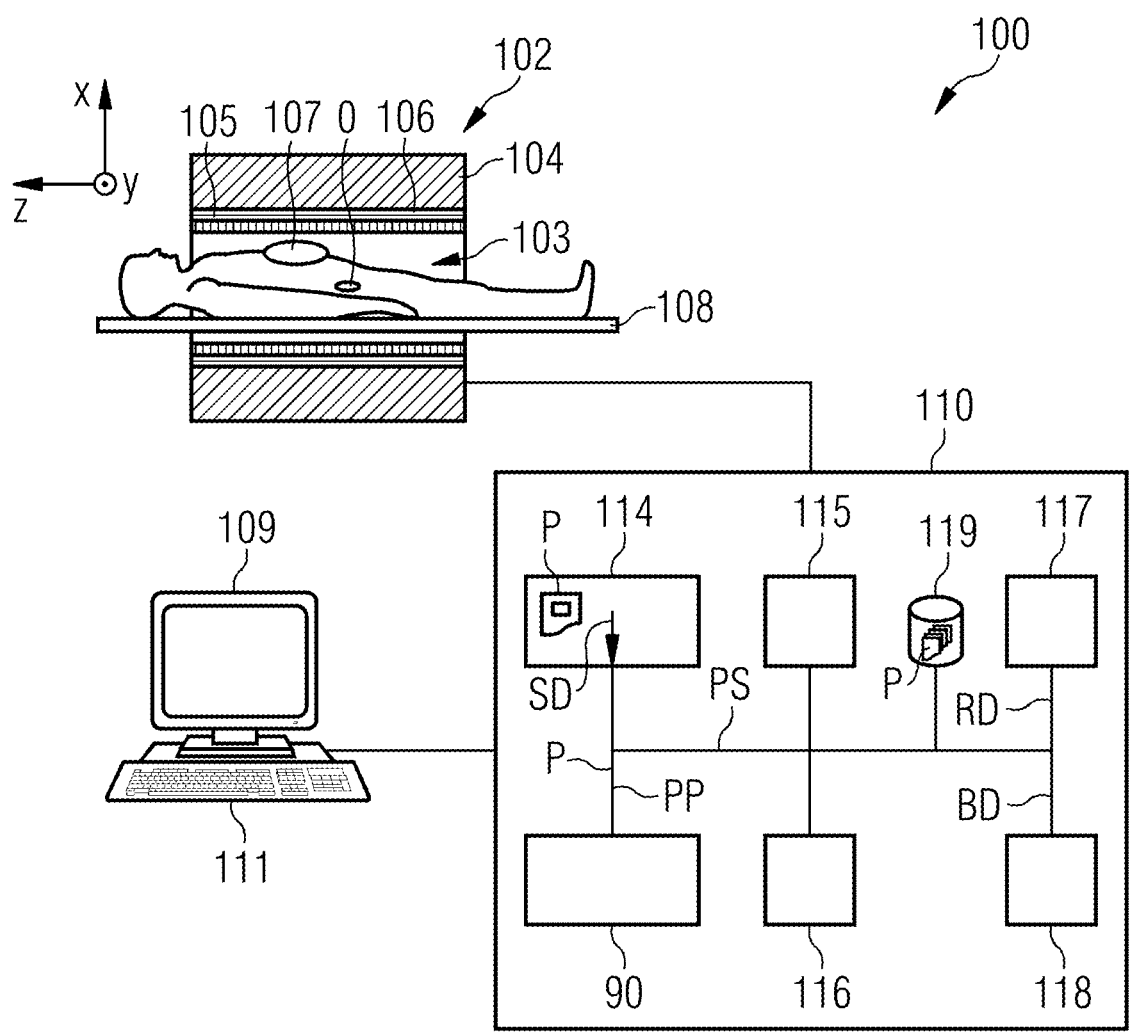
FIG. 10 depicts a schematic representation of a magnetic resonance imaging system according to an embodiment.

FIG. 10 depicts a sketch of a magnetic resonance imaging system 100 (referred to below as "MR system" for short). It includes the actual magnetic resonance scanner 102 containing an examination space 103 or patient tunnel, into which may be moved on a couch 108 an object under examination O, or rather in this case a patient or person under examination, in whose body is located, for instance, a specific organ to be mapped.

The magnetic resonance scanner 102 is equipped with a main magnetic field system 104, a gradient system 106 and also an RF transmit antenna system 105 and an RF receive antenna system 107. In the embodiment shown, the RF transmit antenna system 105 is a body coil that is fixed in the magnetic resonance scanner 102, whereas the RF receive antenna system 107 consists of local coils (represented in FIG. 10 by a single local coil) to be arranged on the patient or person under examination. In principle, however, the whole-body coil 105 may also be used as the RF receive antenna system, and the local coils 107 may be used as the RF transmit antenna system, provided these coils may each be switched into different operating modes.

The MR system 100 also includes a central control device 110, that is used to control the MR system 100. This central control device 110 includes a sequence control unit 114 for controlling the pulse sequence. This is used to specify the timing of radiofrequency pulses (RF pulses) and gradient pulses according to a selected imaging sequence PS. Such an imaging sequence PS may be specified, for example, in a measurement or control protocol P. Different control protocols P for different measurements are typically stored in a memory 119, and may be selected by an operator (and possibly modified if required), and then used to perform the measurement.

For the output of the individual RF pulses, the central control device 110 includes a radiofrequency transmit device 115, that generates and amplifies the RF pulses and feeds the RF pulses into the RF transmit antenna system 105 via a suitable interface (details not presented). The control device 110 includes a gradient system interface 116 for controlling the gradient coils of the gradient system 106. The sequence controller 114 communicates in a suitable manner, for example by sending out sequence control data SD, with the radiofrequency transmit unit 115 and the gradient system interface 116 for the emission of the pulse sequences PS. The control device 110 also includes a radiofrequency receive device 117 (likewise communicating with the sequence control unit 114 in a suitable manner) for the purpose of coordinated acquisition of magnetic resonance signals received by the RF receive antenna system 107. A reconstruction unit 118 receives the acquired data after demodulation and digitization as raw data RD or k-space data RD and reconstructs the MR image data BD therefrom. This image data BD may then be stored in a memory 119, for example, or displayed via a display unit 109.

The central control device 110 may be operated by a terminal having an input unit 111 and the display unit 109, via which an operator may hence also operate the entire MR system 100. MR images may also be displayed on the display unit 109, and the input unit 111, if applicable in combination with the display unit 109, may be used to plan and start measurements, and for example to select and, if applicable, modify suitable control protocols containing suitable measurement sequences, as described above.

FIG. 10 also depicts the preparation device 90 already illustrated in FIG. 9. The preparation device 90 is configured to modify a measurement protocol P having protocol parameters PP in such a way that a maximum gradient slew rate $S_{max}$ associated with a selected representative pulse sequence segment R-PSA is not exceeded. For adjusting the measurement protocol P, first a value range of one or more protocol parameters is determined such that in the value range the previously determined maximum gradient slew rate $S_{max}$ is not exceeded by the pulse sequence segment M-PSA being considered and to be modified.

The previously determined value range is presented before or during the change to a relevant protocol parameter.

Furthermore, the MR system 100 and for example the control device 110 may also include a multiplicity of further components, that are not presented here in detail but are typically present in such equipment, for instance components such as a network interface, in order to connect the entire system to a network and to be able to transfer raw data RD and/or image data BD or parameter maps, but also further data such as patient-related data or control protocols, for example.

The principles of how suitable raw data RD may be acquired by applying RF pulses and generating gradient fields, and how MR images BD may be reconstructed from the raw data, are known to a person skilled in the art and are not explained further here.

Embodiments provide an effective improvement in, in terms of the length of time needed, a method for preparing magnetic resonance imaging of an object under examination and a magnetic resonance imaging method.

Finally, it shall be reiterated that the detailed methods and assemblies described above are merely exemplary embodiments, and that the basic principle may also be modified in many aspects by a person skilled in the art without departing from the scope of the invention insofar as this is defined by the claims. It is mentioned for the sake of completeness that the use of the indefinite article "a" or "an" does not rule out the possibility of there also being more than one of the features concerned. Likewise, the term "unit" does not exclude the possibility that the unit consists of a plurality of components, that may also be spatially distributed if applicable. Independent of the grammatical term usage, individuals with male, female or other gender identities are included within the term.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that the dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for preparing magnetic resonance imaging of an object under examination, the method comprising:
generating, by a processor, a plurality of representative pulse sequence segments, each of which is associated with a reference gradient amplitude of a gradient pulse having a highest stimulation potential of the representative pulse sequence segment, and a stimulation potential of which is representative of a group of partially different pulse sequences;
determining, by the processor, for each of the representative pulse sequence segments, a maximum gradient slew rate for which a permitted maximum value of the stimulation potential is not exceeded;
determining and selecting, by the processor for a measurement protocol to be planned for a magnetic resonance imaging examination to be performed, one of the representative pulse sequence segments according to a gradient amplitude of the gradient pulse having the highest stimulation potential of a pulse sequence segment of a pulse sequence on which the measurement protocol is based;
adjusting, by the processor, the pulse sequence segment of the pulse sequence on which the measurement protocol is based in such a way that a maximum gradient slew rate associated with the selected representative pulse sequence segment is also not exceeded by the pulse sequence segment of the pulse sequence on which the measurement protocol is based; and
acquiring raw MR data of the object using the pulse sequence corresponding to the measurement protocol.

2. A preparation device comprising:
a representative-data generation unit configured to generate a plurality of representative pulse sequence segments, each of which is associated with a reference gradient amplitude of a gradient pulse having a highest stimulation potential of the representative pulse sequence segment, and a stimulation potential of which is representative of a group of partially different pulse sequences;
a rise determination unit configured to determine, for each of the representative pulse sequence segments, a maximum gradient slew rate for which a permitted maximum value of the stimulation potential is not exceeded;
a selection unit configured to determine and select, for a measurement protocol for a magnetic resonance imaging examination, one of the representative pulse sequence segments according to a gradient amplitude of the gradient pulse having the highest stimulation potential of a pulse sequence segment of a pulse sequence on which the measurement protocol is based;
an adaptation unit configured to adjust the pulse sequence segment of the pulse sequence on which the measurement protocol is based in such a way that a maximum gradient slew rate associated with the selected representative pulse sequence segment is also not exceeded by the pulse sequence segment of the pulse sequence on which the measurement protocol is based;
wherein raw MR data of the object is acquired using the pulse sequence corresponding to the measurement protocol.

3. A non-transitory computer implemented storage medium that stores machine-readable instructions executable by at least one processor for preparing magnetic resonance imaging of an object under examination, the machine-readable instructions comprising:
generating a plurality of representative pulse sequence segments, each of which is associated with a reference gradient amplitude of a gradient pulse having a highest stimulation potential of the representative pulse sequence segment, and a stimulation potential of which is representative of a group of partially different pulse sequences; determining, for each of the representative pulse sequence segments, a maximum gradient slew rate for which a permitted maximum value of the stimulation potential is not exceeded;
determining and selecting, for a measurement protocol to be planned for a magnetic resonance imaging examination to be performed, one of the representative pulse sequence segments according to a gradient amplitude of the gradient pulse having the highest stimulation potential of a pulse sequence segment of a pulse sequence on which the measurement protocol is based; and
adjusting the pulse sequence segment of the pulse sequence on which the measurement protocol is based in such a way that a maximum gradient slew rate associated with the selected representative pulse sequence segment is also not exceeded by the pulse sequence segment of the pulse sequence on which the measurement protocol is based;
wherein raw MR data of the object is acquired using the pulse sequence corresponding to the measurement protocol.

4. The method of claim 1, wherein for adjusting, a value range of allowed protocol parameter values that is defined for planning the measurement protocol is modified in such a way that the determined maximum gradient slew rate is not exceeded.

5. The method of claim 1, wherein a parameter value range is displayed to a user according to the maximum gradient slew rate, from which range the user may select a parameter value for a protocol parameter to be adjusted for the measurement protocol to be planned.

6. The method of claim 1, wherein a plurality of protocol parameters are adjusted, wherein a value of a second protocol parameter is adjusted according to a parameter value selected for a first parameter in such a way that the maximum gradient slew rate is observed.

7. The method of claim 1, wherein at least one of the representative pulse sequence segments comprises one of the following gradient pulse series: a pair of gradient pulses of the same polarity; a pair of gradient pulses of different polarity; a series of gradient pulses of the same polarity; or a series of gradient pulses of alternating polarity.

8. The method of claim 1, wherein the pulse sequence on which the measurement protocol is based has a pulse sequence segment that is not higher in terms of the stimulation potential to the selected representative pulse sequence segment.

9. The method of claim 1, wherein the generating of the plurality of representative pulse sequence segments takes place during a development of a computer program for magnetic resonance imaging for a magnetic resonance imaging system.

10. The method of claim 1, wherein the generating of the plurality of representative pulse sequence segments is performed during startup of a magnetic resonance imaging system.

11. The method of claim 1, wherein generating of the plurality of representative pulse sequence segments for a specific pulse sequence of a measurement protocol to be planned is performed before a startup of a computer program for the magnetic resonance imaging using the specific pulse sequence.

12. The method of claim 1, wherein determining of a maximum gradient slew rate is performed in such a way that it is also not exceeded for a maximum gradient amplitude.

13. The method of claim 1, further comprising:
 reconstructing image data from the object under examination on the basis of the acquired raw MR data.

\* \* \* \* \*

UNITED STATES PATENT AND TRADEMARK OFFICE
CERTIFICATE OF CORRECTION

PATENT NO. : 12,222,412 B2
APPLICATION NO. : 18/592973
DATED : February 11, 2025
INVENTOR(S) : Thorsten Feiweier et al.

It is certified that error appears in the above-identified patent and that said Letters Patent is hereby corrected as shown below:

In the Claims

Column (23) (Claim 1, Line 8):
"A method for preparing magnetic resonance imaging of"
Should be replaced with:
"A method for magnetic resonance imaging of"

Signed and Sealed this
First Day of April, 2025

Coke Morgan Stewart
*Acting Director of the United States Patent and Trademark Office*